(12) United States Patent
Ohtani et al.

(10) Patent No.: US 8,497,822 B2
(45) Date of Patent: Jul. 30, 2013

(54) LIGHT EMITTING DEVICE AND DRIVING METHOD OF THE SAME

(75) Inventors: Hisashi Ohtani, Tochigi (JP); Yoshifumi Tanada, Kanagawa (JP); Aya Anzai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 425 days.

(21) Appl. No.: 12/873,507

(22) Filed: Sep. 1, 2010

(65) Prior Publication Data

US 2010/0321420 A1 Dec. 23, 2010

Related U.S. Application Data

(63) Continuation of application No. 11/568,158, filed as application No. PCT/JP2005/007574 on Apr. 14, 2005, now Pat. No. 7,791,571.

(30) Foreign Application Priority Data

Apr. 22, 2004 (JP) .................................. 2004-126798

(51) Int. Cl.
*G09G 3/30* (2006.01)
(52) U.S. Cl.
USPC ............................................. 345/76; 345/77
(58) Field of Classification Search
USPC ......................................... 345/76, 82, 83, 77
See application file for complete search history.

(56) References Cited

U.S. PATENT DOCUMENTS

| | | | |
|---|---|---|---|
| 6,104,363 | A | 8/2000 | Kobayashi et al. |
| 6,372,608 | B1 | 4/2002 | Shimoda et al. |
| 6,429,601 | B1 | 8/2002 | Friend et al. |
| 6,597,348 | B1 | 7/2003 | Yamazaki et al. |
| 6,633,122 | B2 | 10/2003 | Kijima et al. |
| 6,714,178 | B2 | 3/2004 | Koyama et al. |
| 6,720,092 | B2 | 4/2004 | Hatwar |
| 6,909,442 | B2 | 6/2005 | Hiyama et al. |
| 6,950,082 | B2 | 9/2005 | Sung et al. |

(Continued)

FOREIGN PATENT DOCUMENTS

| | | |
|---|---|---|
| EP | 0905672 A1 | 3/1999 |
| EP | 1103946 B1 | 5/2001 |

(Continued)

OTHER PUBLICATIONS

Taiwanese Office Action (TW Application No. 94112568), dated Jul. 5, 2012 with English translation.

(Continued)

*Primary Examiner* — Kevin M Nguyen
(74) *Attorney, Agent, or Firm* — Fish & Richardson P.C.

(57) ABSTRACT

The invention provides a light emitting device which can suppress the reduction of luminance in accordance with the light emission time and light emission at a high luminance. Moreover, the invention relates to a driving method which can suppress the reduction of luminance in accordance with the light emission time and light emission at a high luminance. The light emitting device of the invention can display a plurality of colors of which brightness and chromaticity are different by visually mixing light emission of a plurality of light emitting elements of which light emission colors are different. When a visually mixed display color is formed, a white light emission is exhibited.

8 Claims, 11 Drawing Sheets

U.S. PATENT DOCUMENTS

| | | |
|---|---|---|
| 6,958,750 B2 | 10/2005 | Azami et al. |
| 6,961,038 B2 | 11/2005 | Yoshinaga et al. |
| 7,129,914 B2 | 10/2006 | Knapp et al. |
| 7,148,630 B2 | 12/2006 | Koyama et al. |
| 7,218,298 B2 | 5/2007 | Yamazaki et al. |
| 7,403,177 B2 | 7/2008 | Tanada et al. |
| 7,561,124 B2 | 7/2009 | Kwak et al. |
| 7,791,571 B2 | 9/2010 | Ohtani et al. |
| 7,903,052 B2 | 3/2011 | Kwak et al. |
| 7,956,349 B2 | 6/2011 | Tsutsui et al. |
| 8,125,415 B2 | 2/2012 | Koyama et al. |
| 2001/0022565 A1* | 9/2001 | Kimura ................ 345/82 |
| 2001/0035863 A1 | 11/2001 | Kimura |
| 2002/0063670 A1 | 5/2002 | Yoshinaga et al. |
| 2002/0075216 A1 | 6/2002 | Satake |
| 2003/0011584 A1 | 1/2003 | Azami et al. |
| 2003/0058210 A1 | 3/2003 | Yamazaki et al. |
| 2003/0107537 A1 | 6/2003 | Ochi et al. |
| 2003/0117348 A1 | 6/2003 | Knapp et al. |
| 2004/0036664 A1* | 2/2004 | Miyazawa ................ 345/76 |
| 2004/0217714 A1 | 11/2004 | Yoneda |
| 2005/0030268 A1 | 2/2005 | Zhang et al. |
| 2005/0237288 A1 | 10/2005 | Yoshinaga et al. |
| 2006/0066530 A1 | 3/2006 | Azami et al. |
| 2010/0328367 A1 | 12/2010 | Kwak et al. |
| 2012/0153293 A1 | 6/2012 | Koyama et al. |

FOREIGN PATENT DOCUMENTS

| | | |
|---|---|---|
| EP | 1204087 B1 | 5/2002 |
| EP | 1231593 A3 | 8/2002 |
| EP | 1 381 096 A2 | 1/2004 |
| EP | 1 538 594 A2 | 6/2005 |
| GB | 130411 A | 8/1919 |
| JP | 57-132189 A | 8/1982 |
| JP | 59-040996 Y2 | 3/1984 |
| JP | 04-022990 U | 1/1992 |
| JP | 10-055154 A | 2/1998 |
| JP | 2000-147569 A | 5/2000 |
| JP | 2001-343933 A | 12/2001 |
| JP | 2002-229531 A | 8/2002 |
| JP | 2002-287664 | 10/2002 |
| JP | 2002-297083 A | 10/2002 |
| JP | 2003-091260 A | 3/2003 |
| JP | 2004-077742 A | 3/2004 |
| JP | 2004-117921 A | 4/2004 |
| JP | 2005-513554 A | 5/2005 |
| JP | 2005-148751 A | 6/2005 |
| TW | 554638 A | 9/2003 |
| TW | 200303499 A | 9/2003 |
| TW | 573178 A | 1/2004 |
| TW | 200401584 A | 1/2004 |
| TW | 200405245 A | 4/2004 |
| WO | WO 03/054844 A1 | 7/2003 |
| WO | 2004/021327 A1 | 3/2004 |
| WO | 2005/104072 A1 | 11/2005 |

OTHER PUBLICATIONS

International Search Report (Application No. PCT/JP2005/007574) dated Jun. 14, 2005.

Written Opinion (Application No. PCT/JP2005/007574) dated Jun. 14, 2005.

* cited by examiner

LIGHT EMITTING DEVICE AND DRIVING METHOD OF THE SAME

CROSS-REFERENCE TO RELATED APPLICATIONS

This application is a continuation of U.S. application Ser. No. 11/568,158, filed Oct. 20, 2006, now allowed, which is a 371 of International Application No. PCT/JP2005/007574, filed Apr. 14, 2005, now WO 2005/104072A1, which claims the benefit of a foreign priority application filed in Japan as Serial No. 2004-126798 on Apr. 22, 2004, all of which are incorporated by reference.

TECHNICAL FIELD

The present invention relates to a light emitting device which displays colors using light emission of a light emitting element, and a driving method thereof.

BACKGROUND ART

A light emitting device using light emission of an electroluminescence element (light emitting element) is wide in viewing angle and low in power consumption. In recent years, a light emitting device which can provide high quality images has been actively researched and developed in view of capturing a market as a display device applicable to various information processing devices such as a television receiver and a car navigation system.

The luminance of the light emitting element decays with light emission time. Such a decay becomes notable when the light emitting element keeps emitting light at a high luminance. Such a luminance decay causes the change in display color of the light emitting device which functions as a display device, leading to degrade the image quality.

Therefore, a light emitting element with long life, of which luminance decay according to the light emission time is suppressed has been developed. For example, Patent Document 1 discloses a driving method of a light emitting element of which long life can be achieved by applying a recovering voltage. It is important to prolong the life of the light emitting element in order to provide a light emitting device which can display high quality images.

[Patent Document 1] Japanese Patent Laid-Open No. 10-55154

DISCLOSURE OF INVENTION

The invention provides a light emitting device of which luminance decay caused with the light emission time or by the light emission at a high luminance can be decreased. Moreover, the invention relates to a driving method which can suppress the reduction of luminance in accordance with the light emission time and light emission at a high luminance.

According to the light emitting device of the invention, a plurality of display colors of different brightness and chromaticities can be obtained by visually mixing light emission of a plurality of light emitting elements of which emission colors are different. By forming a display color which is visually mixed, a white light emission can be obtained.

According to the light emitting device of the invention, a plurality of first light emitting elements of which light emission colors are different, and a second light emitting element which emit white color are provided. When the light emitting device of the invention is driven, a video signal is inputted to a second transistor which is provided for controlling a current supply to the first light emitting elements through a common first transistor. The second transistor is turned on or off by this video signal. The first light emitting elements emit light or no light at different timings. Here, when at least one of the first light emitting elements emits light, a step where the second light emitting element emits light which emits white light is provided additionally.

According to the light emitting device of the invention, a plurality of light emitting elements which emit different colors each are provided. When the light emitting device of the invention is driven, a video signal is inputted to a second transistor which is provided for controlling a current supply to the light emitting elements through a common first transistor. The second transistor is turned on or off by this video signal. The light emitting elements emit light or no light at different timings. Here, when at least one of the light emitting elements emits light, a step where at least two light emitting elements emit light at the same time to obtain white color emission is provided additionally.

According to the light emitting device of the invention, a gate signal line, a source signal line, n current supply lines (n is a natural number, satisfying 2=n), a power source, a first transistor for controlling a video signal input, n second transistors for controlling a current supply from the current supply line, and n light emitting elements of which emission colors are different. A gate electrode of the first transistor is electrically connected to the gate signal line while a first electrode thereof is electrically connected to the source signal line. A second electrode of the first transistor is electrically connected to a gate electrode of the second transistor. Here, in an m-th light emitting element (m is a natural number, satisfying 2=m=n−1), a first electrode of the m-th light emitting element is electrically connected to an m-th current supply line through an m-th second transistor while a second electrode of the same is electrically connected to an (m+1)th current supply line through a (m+1)th second transistor. In an n-th light emitting element, the first electrode is electrically connected to an n-th current supply line through an n-th second transistor while the second electrode is electrically connected to the power source.

According to the light emitting device of the invention, electrodes and a light emitting layer of a light emitting element are stacked alternately. The light emitting device of the invention includes a driving transistor and a current supply line. Here, the electrodes of the light emitting element are electrically connected to different current supply lines respectively through different driving transistors.

According to the invention, a light emitting device which exhibits white light emission can be provided. By performing a white light emission, the luminance of the display color and the contrast of an image can be enhanced. Accordingly, for example, when forming a display color by mixing light emission of red, green, and blue light emitting elements, load imposed on each light emitting element can be reduced, leading to a long life of the light emitting element.

BEST MODE FOR CARRYING OUT THE INVENTION

Hereinafter described is one mode of the invention. Although the invention will be fully described by way of example with reference to the accompanying drawings, it is to be understood that various changes and modifications will be apparent to those skilled in the art. Therefore, unless such changes and modifications depart from the scope of the invention, they should be construed as being included therein.

Embodiment Mode 1

A circuit included in a pixel portion of the light emitting device of the invention is described with reference to FIG. 1.

Figure 1:
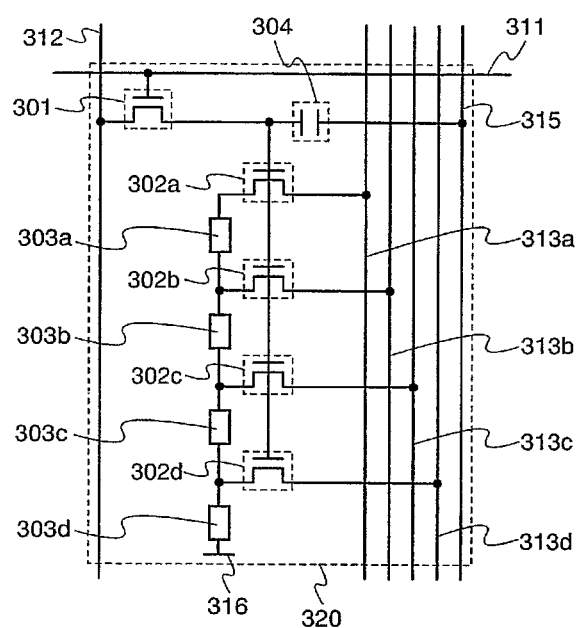
FIG. 1 is a diagram showing a driver circuit used in the light emitting device of the invention.

FIG. 1 is a diagram showing a circuit configuration of a pixel 320 included in the light emitting device of the invention.

A switching transistor 301, driving transistors 302a, 302b, 302c, and 302d each has three terminals: a gate electrode, a drain region, and a source region, in which a channel region is provided between the drain region and the source region. Here, the source region and the drain region cannot be clearly distinguished because of the structure, operating condition, and the like of the transistor, therefore, one of them is referred to as a first electrode while the other is referred to as a second electrode. Here, a switching transistor controls a video signal input to a driving transistor. The driving transistor determines light emission or no light emission of a light emitting element by controlling a current supply from a current supply line according to the inputted video signal. It is to be noted that the switching transistors 301, the driving transistors 302a, 302b, 302c, and 302d are not particularly limited and an organic thin film transistor containing a semiconductor layer formed of an organic compound can be used as well as a MOS transistor and the like. The switching transistor 301 may be an N-channel transistor or a P-channel transistor. Furthermore, the driving transistors 302a, 302b, 302c, and 302d may be an N-channel transistor or a P-channel transistor, however, it is preferable that they have the same polarity because they are controlled by the same video signal according to the example shown in FIG. 1.

Light emitting elements 303a, 303b, 303c, and 303d each has two terminals. Each of the light emitting elements 303a, 303b, 303c, and 303d has a light emitting layer between a first electrode and a second electrode and emits light when a current flows by a potential difference between the first electrode and the second electrode. It is to be noted that when the driving transistors 302a, 302b, 302c, and 302d are P-channel transistors, the first electrode of each of the light emitting elements 303a, 303b, 303c, and 303d functions as an anode while the second electrode thereof functions as a cathode. On the other hand, when the driving transistors 302a, 302b, 302c, and 302d are N-channel transistors, the first electrode of each of the light emitting elements 303a, 303b, 303c, and 303d functions as a cathode while the second electrode thereof functions as an anode. The light emission colors of the light emitting elements 303a, 303b, 303c, and 303d are not particularly limited, however, it is preferable that they emit light of different colors respectively. Further, it is preferable that one of the light emitting elements exhibit white light emission or the white light emission be exhibited by mixing light emission of at least two light emitting elements. The light emitting element 303a exhibits red light emission when light is emitted outside the light emitting device, the light emitting element 303b exhibits green light emission when light is emitted outside the light emitting device, the light emitting element 303c exhibits blue light emission when light is emitted outside the light emitting device, and the light emitting element 303d exhibits white light emission when light is emitted outside the light emitting device. Here, the red light emission corresponds to a color having color co-ordinates: $x=0.6$ or higher and $y=0.35$ or lower in the CIE-XYZ chromaticity diagram. The green light emission corresponds to a color having color co-ordinates: $x=0.3$ or lower and $y=0.6$ or higher in the CIE-XYZ chromaticity diagram. The blue light emission corresponds to a color having color co-ordinates: $x=0.15$ or lower and $y=0.2$ or lower in the CIE-XYZ chromaticity diagram. The white light emission corresponds to a color having color co-ordinates: $x=0.25$ to $0.35$ and $y=0.25$ to $0.35$ in the CIE-XYZ chromaticity diagram, and preferably $x=0.28$ to $0.32$ and $y=0.28$ to $0.32$. It is to be noted that the CIE-XYZ chromaticity diagram is a chromaticity diagram based on the tristimulus values of X, Y, and Z. The chromaticity diagram shows a color by x and y co-ordinate space based on the tristimulus values of X, Y and Z. It is to be noted that the chromaticity defines the kinds of light colors quantitatively, leaving aside the brightness information.

In the switching transistor 301, a gate electrode is electrically connected to a gate signal line 311 while a first electrode is electrically connected to the source signal line 312. The light emitting elements 303a, 303b, 303c, and 303d are connected in series. The first electrode of the driving transistor 302a is electrically connected to a current supply line 313a while a second electrode thereof is electrically connected to the first electrode of the light emitting element 303a. In the driving transistor 302b, a first electrode is electrically connected to a current supply line 313b and the second electrode thereof is electrically connected to the first electrode of the light emitting element 303b. In the driving transistor 302c, a first electrode is electrically connected to a current supply line 313c and a second electrode is electrically connected to the first electrode of the light emitting element 303c. In the driving transistor 302d, a first electrode is electrically connected to a current supply line 313d and a second electrode thereof is electrically connected to a first electrode of the light emitting element 303d. It is to be noted that a second electrode of the light emitting element 303d is electrically connected to a power source 316. Gate electrodes of the driving transistors 302a, 302b, 302c, and 302d are electrically connected to each other. Further, a capacitor 304 is provided between a capacitor line 315 and the gate electrodes of the driving transistors 302a, 302b, 302c, and 302d so that potentials of the gate electrodes of the driving transistors 302a, 302b, 302c, and 302d can be held. Moreover, a second electrode of the switching transistor 301 is electrically connected to the gate electrodes of the driving transistors 302a, 302b, 302c, and 302d.

In this embodiment mode, a configuration having four light emitting elements is described, however, the number of light emitting elements is not limited to this. However, it is preferable that at least two light emitting elements are provided. The number of the driving transistors and the number of the current supply lines are not particularly limited. When n (n is preferably two or more) light emitting elements are provided, it is preferable that n current supply lines and n driving transistors be provided. It is preferable in an m-th (2=m=n) light emitting element that a first electrode is electrically connected to an m-th current supply line and a second electrode is electrically connected to an (m+1)th current supply line or a power source.

Next, a driving method of the circuit shown in FIG. 1 is described. When the gate signal line 311 is selected, the switching transistor 301 is turned on and a video signal is inputted from the source signal line 312 to the gate electrodes of the driving transistors 302a, 302b, 302c, and 302d through the switching transistor 301. Here, when the switching transistor 301 is an N-channel transistor while the driving transistors 302a, 302b, 302c, and 302d are P-channel transistors, the driving transistors 302a, 302b, 302c, and 302d are turned on when the video signal is Low while they are turned off when the video signal is High. Furthermore, when the current supply lines 313a and 313b have different potentials, a potential difference generates between the first electrode and the second electrode of the light emitting element 303a. Accordingly, a current is supplied to the light emitting element 303a and it emits light. When the current supply line 313b and the current supply line 313c have different potentials, a potential difference generates between the first electrode and the second electrode of the light emitting element 303b. Accordingly, a current is supplied to the light emitting element 303b and it emits light. When the current supply line 313c and the current supply line 313d have different potentials, a potential difference generates between the first electrode and the second electrode of the light emitting element 303c. Accordingly, a current is supplied to the light emitting element 303c and it emits light. Further, when the current supply line 313d and the power source 316 have different potentials, a potential difference generates between the first electrode and the second electrode of the light emitting element 303d. Accordingly, a current is supplied to the light emitting element 303d and it emits light.

As described above, the light emitting elements 303a, 303b, 303c, and 303d can emit light. The light emitting elements 303a, 303b, 303c, and 303d are controlled to emit light or no light independently from each other. Therefore, for example, the light emitting element 303a only may emit light by setting the current supply lines 313a and 313b at different potentials and the current supply lines 313b, 313c, 313d, and the power source line 316 at the same potential. Alternatively, the light emitting elements 303a, 303b, 303c, and 303d all may emit light by setting the current supply lines 313a and 313b at different potentials while setting the current supply lines 313b and 313c, the current supply lines 313c and 313d, and the current supply line 313d and the power source 316 at different potentials respectively.

The aforementioned circuit can drive a light emitting element to emit a white light.

Embodiment Mode 2

In this embodiment mode, the light emitting device of the invention including a pixel having the circuit configuration described in Embodiment Mode 1 and a driving method thereof are described.

Figure 2:
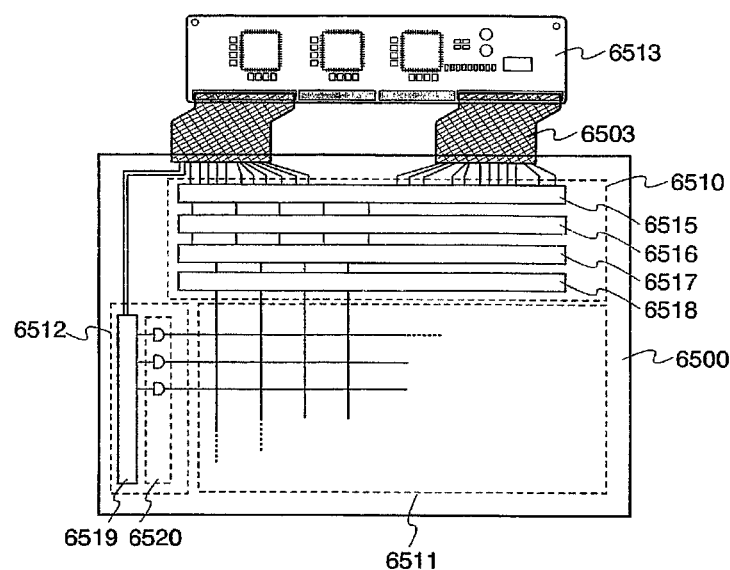
FIG. 2 is a schematic diagram of the light emitting device of the invention.

FIG. 2 is a schematic diagram of a light emitting device seen from the top, to which the invention is applied. In FIG. 2, a region 6510 surrounded by a dotted line denotes a driver circuit portion (a source driver circuit), a region 6511 denotes a pixel portion, and a region 6512 denotes a driver circuit portion (a gate driver circuit). The pixel portion 6511 is provided with the light emitting element of the invention. The driver circuit portions 6510 and 6512 are connected to an FPC 6503 as an external input terminal through wirings formed on a substrate 6500. The driver circuit portions 6510 and 6512 are inputted with signals by receiving a video signal, a clock signal, a start signal, a reset signal and the like from the FPC (Flexible Printed Circuit) 6503. A printed wiring board (PWB) 6513 is attached to the FPC 6503. The driver circuit portion 6510 is provided with a shift register 6515, a switch 6516, and memories (latches) 6517 and 6518. The driver circuit portion 6512 is provided with a shift register 6519 and a buffer 6520.

The driver circuit portions are not necessarily provided over the same substrate as the pixel portion 6511 as described above and may be provided outside the substrate by using an IC chip mounted on an FPC in which a wiring pattern is formed (TCP) and the like. Moreover, the circuit configurations of the driver circuit portions 6510 and 6512 are not limited to the aforementioned, and a configuration in which a circuit having a different function than the aforementioned may be employed as well.

Figure 3:
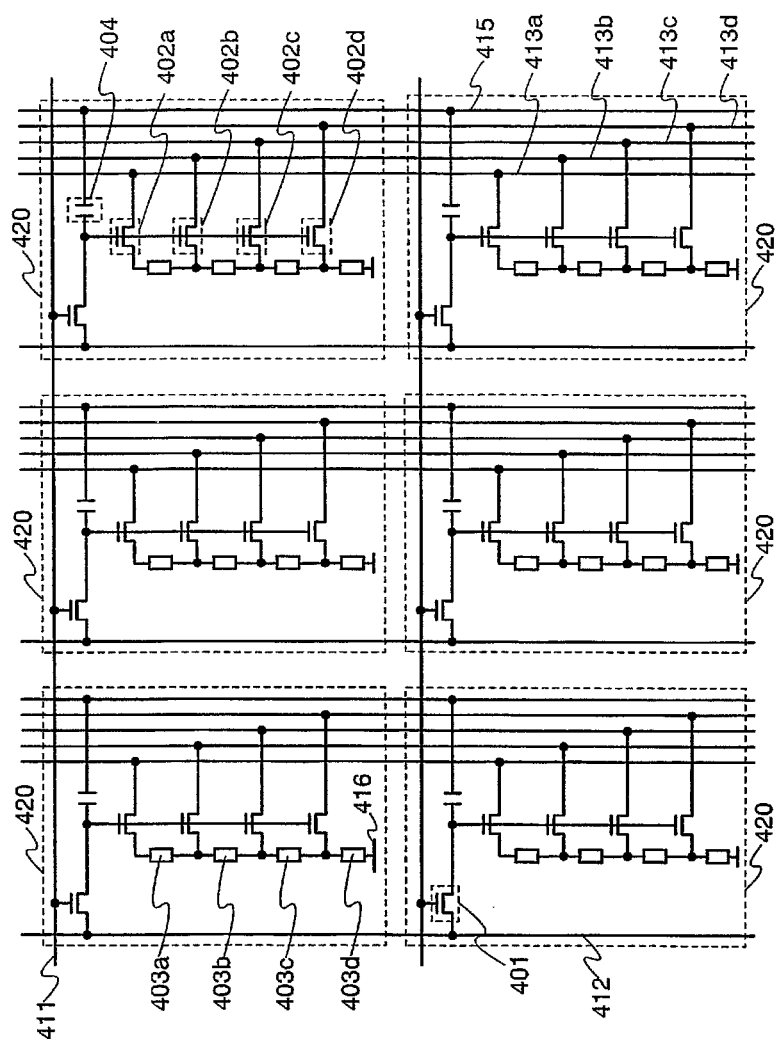
FIG. 3 is a diagram showing a driver circuit used in the light emitting device of the invention.

As shown in FIG. 3, the pixel portion 6511 is provided with a plurality of source signal lines 412 which extend in the column direction arranged in the row direction. The current supply lines 413a, 413b, 413c, and 413d as one group are arranged in the row direction. Moreover, a plurality of gate signal lines 411 which extend in the row direction are arranged in the column direction. The pixel portion 6511 includes circuits 420 each having a similar configuration to that described in Embodiment Mode 1. A plurality of the circuits 420 each having a gate signal line 411, a source signal line 412, a current supply line 413, a power source 416, a switching transistor 401, driving transistors 402a, 402b, 402c, and 402d, light emitting elements 403a, 403b, 403c, and 403d are arranged in the longitudinal direction and the lateral direction. It is to be noted that the circuit 420 may include a capacitor 404. In the circuit 420, the gate signal line 411 corresponds to the gate signal line 311 in Embodiment Mode 1 while the source signal line 412 corresponds to the source signal line 312 in Embodiment Mode 1, the current supply lines 413a, 413b, 413c, and 413d correspond to the current supply lines 313a, 313b, 313c, and 313d in Embodiment Mode 1, the power source 416 corresponds to the power source 316 in Embodiment Mode 1, and a capacitor line 415 corresponds to the capacitor line 315 in Embodiment Mode 1. The switching transistor 401 corresponds to the switching transistor 301 in Embodiment Mode 1, the driving transistors 402a, 402b, 402c, and 402d correspond to the driving transistors 302a, 302b, 302c, and 302d in Embodiment Mode 1, and the capacitor 404 corresponds to the capacitor 304 in Embodiment Mode 1. The light emitting elements 403a, 403b, 403c, and 403d correspond to the light emitting elements 303a, 303b, 303c, and 303d in Embodiment Mode 1.

The light emission colors of the light emitting elements 403a, 403b, 403c, and 403d are not particularly limited, however, it is preferable that any one of these light emitting elements exhibit white light emission. It is to be noted in this embodiment mode that the light emitting element 403a exhibits red light emission when light is emitted outside the light emitting device, the light emitting element 403b exhibits green light emission when light is emitted outside the light emitting device, the light emitting element 403c exhibits blue light emission when light is emitted outside the light emitting device, and the light emitting element 403d exhibits white light emission when light is emitted outside the light emitting device. It is to be noted that the red, green, blue, and white colors described here are similar to those described in Embodiment Mode 1.

Figure 4:
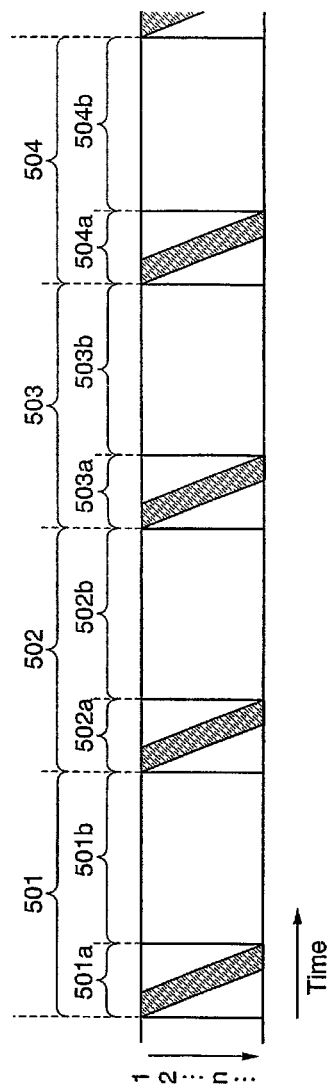
FIG. 4 is a diagram showing a driving method of the light emitting device of the invention.

Next, a driving method is described. FIG. 4 is a diagram showing an operation of a frame with time. In FIG. 4, the lateral direction denotes time while the longitudinal direction denotes a scan stage of the gate signal line.

When displaying an image by using the display device of the invention, a write operation and a display operation of the image are repeated in the display period. The number of this write operation is not particularly limited, however, it is preferable that it is performed at least about 60 times in one second so that a viewer does not sense a flicker. Here, a period in which a write operation and a display operation for one image (one frame) are performed is referred to as one frame period.

One frame is divided by time division into subframes 501, 502, 503, and 504 each of which includes a write period 501a and a hold period 501b, a write period 502a and a hold period 502b, a write period 503a and a hold period 503b, a write period 504a and a hold period 504b respectively.

First, in the subframe 501, the write operation is performed from the first row to the last row. Therefore, a start time of the write period 501a is different in each row. After the write period 501a, the hold period 501b starts. A light emitting element connected to a driving transistor to which a signal for emitting light is supplied in the write period 501a emits light when different potentials are applied in the hold period 501b between the first electrode and the second electrode which sandwich a light emitting layer. In this embodiment mode, in the subframe 501, different potentials are applied to the first electrode and the second electrode of the light emitting element 403a, thus it emits light. At this time, potentials are applied such that respective first and second electrodes of the other light emitting elements 403b, 403c, and 403d have the same potential. After the hold period 501b, the subframe period 502 starts. Similarly to the case of the subframe 501, the write operation is performed from the first row to the last row. Then, the light emitting element 403b emits light in the hold period 502b. After the hold period 502b is terminated in the subframe period 502, the subframe 503 starts. In the subframe 503, the light emitting element 403c emits light. Following the hold period 503b of the subframe 503, the subframe 504 starts. In the subframe 504, the light emitting element 403d emits light. The operation as described above is repeated until the hold period 504b of the subframe 504 is terminated. After the operation in the subframe 504 is terminated, the next frame starts. It is to be noted that the light emitting elements 403a, 403b, 403c, and 403d are emitted in this order in this embodiment mode, however, the order of the light emitting elements to emit light is not particularly limited, and the order can be arbitrarily changed to emit light.

A drive of a pixel in the write period is described next. In the write period, a gate signal line 411 of an n-th row (n is a natural number) is selected, thereby the switching transistor 401 connected to the gate signal line 411 is turned on. At this time, a video signal is inputted to the source signal lines of the first column to the last column at the same time. It is to be noted that video signals inputted from the source signal line 412 of each column are independent from each other. The video signals inputted from the source signal line 412 are inputted to the gate electrodes of the driving transistors 402a, 402b, 402c, and 402d through the switching transistor 401 connected to each source signal line. The light emission and no light emission of the light emitting elements 403a, 403b, 403c, and 403d is determined according to the potential difference between the first electrode and the second electrode of the light emitting elements 403a, 403b, 403c, and 403d and the signals inputted to the driving transistors 402a, 402b, 402c, and 402d. For example, when the driving transistor is a P-channel transistor, any one of the light emitting elements 403a, 403b, 403c, and 403d emits light when a Low signal is inputted. On the other hand, when the driving transistor is an N-channel transistor, any one of the light emitting elements 403a, 403b, 403c, and 403d emits light when a High signal is inputted.

At the same time as the writing to the source signal lines is terminated, a write period in the n-th row (n is a natural number) is terminated and a hold period starts. Next, a write period in the (n+1)th row starts and a similar write operation to that described above is performed. By repeating the aforementioned operation, the write operation is performed from the first row to the last row.

As described above, with the light emitting elements 403a, 403b, and 403c emitting light sequentially, light emission color of each light emitting element is visually mixed by the afterimage effect, thereby various colors can be displayed. It is to be noted that light emission of which luminance is controlled by changing a voltage applied to each light emitting element are appropriately combined to obtain a desired display color. When the light emitting element 403d which exhibits white light emits light, the luminance of the displayed color is perceived to be increased. Thus, load imposed on the light emitting elements 403a, 403b, and 403c can be less than the case of increasing a voltage applied to the light emitting elements 403a, 403b, and 403c, to increase the luminance of the displayed color. As a result, life of each of the light emitting elements 403a, 403b, and 403c can be long. Moreover, when the light emitting element 403d which exhibits white light emits light, the light emitting device described above can display a high contrast image.

Described in this embodiment mode is the mode where all the light emitting elements emit light, however, a desired display color may be obtained with the light emitting elements 403a and 403b emitting light and the light emitting element 403c emitting no light. Alternatively, a desired display color may be obtained with any one of the light emitting elements 403a, 403b, and 403c emitting light. When a display color of low luminance is to be performed, the light emitting element 403d which exhibits white light emission does not necessarily emit light. The timing, luminance and the like at which the light emitting element 403d which exhibits white light emission emits light are appropriately controlled in a series of display operations.

Embodiment Mode 3

In this embodiment mode, a driving method of the light emitting device of the invention is described, which is different than the driving method thereof described in Embodiment Mode 2. It is to be noted that a similar circuit configuration of a pixel portion to that described in Embodiment Mode 2 can be used. In this embodiment mode also, reference numerals shown in FIG. 3 are referred to.

Figure 5:
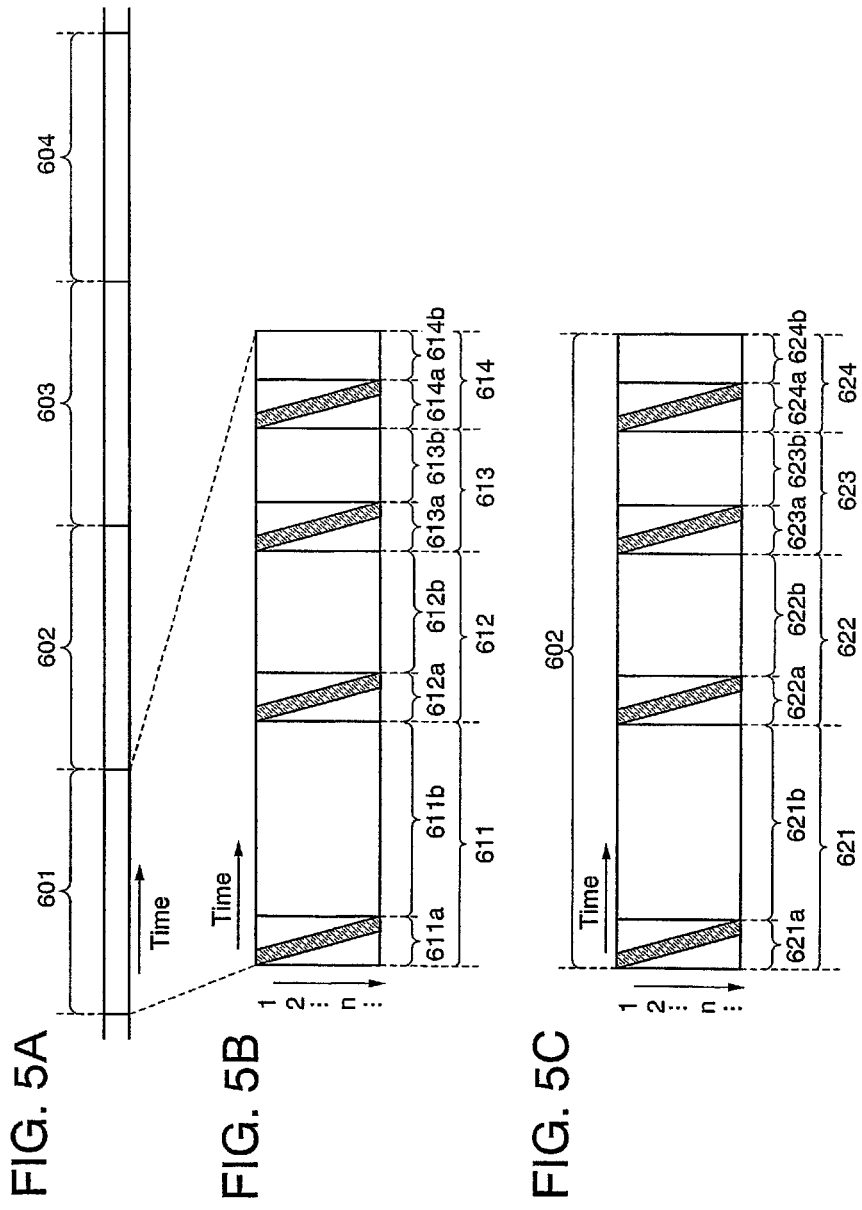
FIGS. 5A to 5C are diagrams showing a driving method of the light emitting device of the invention.

Hereinafter described with reference to FIGS. 5A and 5B is an operation of the light emitting device of this embodiment mode. FIGS. 5A and 5B are diagrams showing operations of frames with time. FIG. 5B is a diagram showing the operation of the frame with time in a first subframe of a plurality of subframes in one frame. In FIG. 5B, the lateral direction denotes time while the longitudinal direction denotes a scan stage of the gate signal line.

Figure 11A:
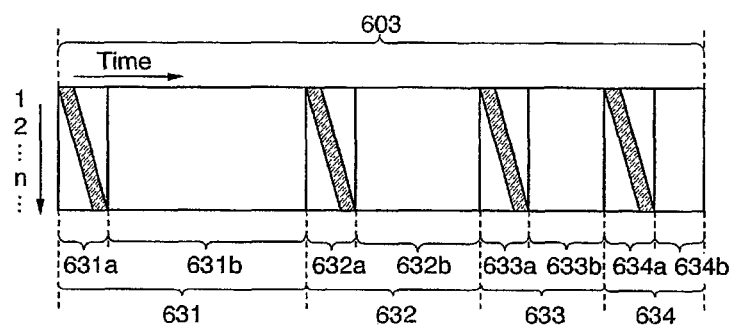
FIGS. 11A and 11B are diagrams showing a driving method of the light emitting device of the invention.
Figure 11B:
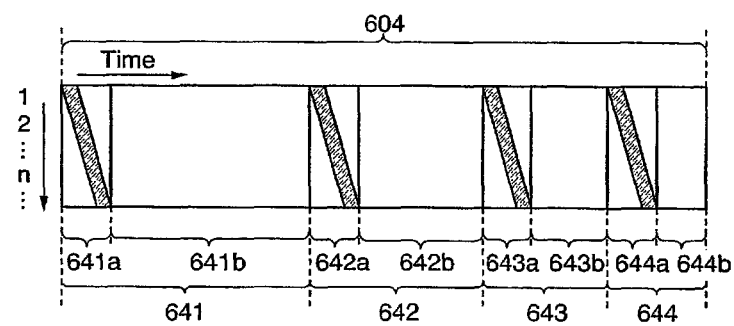

According to the light emitting device of this embodiment mode, one frame is divided into four first subframes 601, 602, 603, and 604 by time division as shown in FIG. 5A. The first subframe 601 is divided into second subframes 611, 612, 613, and 614 by time division (FIG. 5B). The second subframes 611, 612, 613, and 614 each includes a write period and a hold period. The first subframe 602 is divided into second subframes 621, 622, 623, and 624 by time division (FIG. 5C). The second subframes 621, 622, 623, and 624 each includes a write period and a hold period. The first subframe 603 is divided into second subframes 631, 632, 633, and 634 by time division (FIG. 11A). The second subframes 631, 632, 633, and 634 each includes a write period and a hold period. The first subframe 604 is divided into second subframes 641, 642, 643, and 644 by time division (FIG. 11B). The second subframes 641, 642, 643, and 644 each includes a write period and a hold period. A light emitting element which is applied a signal for emitting light emits light in a hold period. The ratio of the hold period length of the second subframes 611, 612, 613, and 614 is the second subframes 611$b$:612$b$:613$b$:614$b$=$2^3$:$2^2$:$2^1$:$2^0$=8:4:2:1. The ratio of the hold period length of the second subframes 621, 622, 623, and 624 is the second subframes 621$b$:622$b$:623$b$:624$b$=$2^3$:$2^2$:$2^1$:$2^0$=8:4:2:1. The ratio of the hold period length of the second subframes 631, 632, 633, and 634 is the second subframes 631$b$:632$b$:633$b$:634$b$=$2^3$:$2^2$:$2^1$:$2^0$=8:4:2:1. The ratio of the hold period length of the second subframes 641, 642, 643, and 644 is the second subframes 641$b$:642$b$:643$b$:644$b$=$2^3 2^1$:$2^0$=8:4:2:1. Accordingly, 4-bit gray scale can be displayed. However, the numbers of bits and gray scale levels are not limited to the aforementioned ones. For example, 8-bit gray scale may be displayed by providing eight second subframes or 4-bit gray scale may be displayed by providing four or more second subframes.

First, an operation in the first subframe 601 is described. It is to be noted that in the first subframe 601, a write period 611$a$ and a hold period 611$b$ are included in the second subframe 611, a write period 612$a$ and a hold period 612$b$ are included in the second subframe 612, a write period 613$a$ and a hold period 613$b$ are included in the second subframe 613, and a write period 614$a$ and a hold period 614$b$ are included in the second subframe 614 respectively. First, in the second subframe 611, a write operation is performed from the first row to the last row sequentially. Therefore, start time of the write period differs depending on the rows. After the write period 611$a$ is terminated, the hold period 611$b$ starts. In the hold period, a light emitting element which is applied a signal for emitting light emits light. Moreover, after the hold period 611$b$ is terminated, the next second subframe 612 starts. After a write operation is performed from the first row to the last row similarly to the second subframe 611, a hold period starts. The aforementioned operation is repeated, and thus up to the hold period of the second subframe 614 is terminated. After the first subframe 601 is terminated as described above, the first subframe 602 starts. Similarly to the first subframe 601, the write period and the hold period are repeated from the second subframe 621 to the second subframe 624 in the first subframe 602. It is to be noted that in the first subframe 602, a write period 621$a$ and a hold period 621$b$ are included in the second subframe 621, a write period 622$a$ and a hold period 622$b$ are included in the second subframe 622, a write period 623$a$ and a hold period 623$b$ are included in the second subframe 623, and a write period 624$a$ and a hold period 624$b$ are included in the second subframe 624. Moreover, as shown in FIG. 11A, in the first subframe 603, a write period 631$a$ and a hold period 631$b$ are included in the second subframe 631, a write period 632$a$ and a hold period 632$b$ are included in the second subframe 632, a write period 633$a$ and a hold period 633$b$ are included in the second subframe 633, and a write period 634$a$ and a hold period 634$b$ are included in the second subframe 634. As shown in FIG. 11B, in the first subframe 604, a write period 641$a$ and a hold period 641$b$ are included in the second subframe 641, a write period 642$a$ and a hold period 642$b$ are included in the second subframe 642, a write period 643$a$ and a hold period 643$b$ are included in the second subframe 643, and a write period 644$a$ and a hold period 644$b$ are included in the second subframe 644. Similarly to the first subframe 601, the write period and the hold period are repeated from the second subframe 631 to the second subframe 634 in the first subframe 603. Similarly to the first subframe 601, the write period and the hold period are repeated from the second subframe 641 to the second subframe 644 in the first subframe 604. In this manner, accumulated time of light emission in each of the first subframes 601, 602, 603, and 604 corresponds to a light emission time of each light emitting element in one frame. It is to be noted in this embodiment mode that the light emitting element 403$a$ which exhibits red light emission emits light in the first subframe 601, the light emitting element 403$b$ which exhibits green light emission emits light in the first subframe 602, the light emitting element 403$c$ which exhibits blue light emission emits light in the first subframe 603, and the light emitting element 403$d$ which exhibits white light emission emits light in the first subframe 604. The luminance of each light emitting element is determined by the accumulated time of light emission in each of the first subframes 601, 602, 603, and 604.

It is to be noted that a hold period starts after the write periods in all the rows are terminated in this embodiment mode, however, the invention is not limited to this. A hold period may start sequentially in the row of which write period is terminated. Moreover, in this embodiment mode, a write period of the next second subframe starts after the hold operations of all the rows are terminated, however, the write period of the next second subframe may start sequentially in the row of which hold period is terminated. In that case, in a subframe of which hold period is longer than a write period including write periods from the first row to the last row, an erase period is provided after the hold period so that the state in which light emitting element emits no light can be forcibly obtained. Accordingly, a write period of the second subframe and a write period of the next second subframe can be prevented from overlapping.

In this embodiment mode, the second subframes 611 to 614, 621 to 624, 631 to 634, and 641 to 644 are arranged in order of descending length respectively. However, they are not necessarily arranged in such an order and they may be arranged in order of ascending length or randomly.

Next, a drive of a pixel in the write period is described. In the write period, the gate signal line 411 of an n-th row (n is a natural number) is selected, thereby the switching transistor 401 connected to the gate signal line 411 is turned on. At this time, a video signal is inputted to source signal lines of the first column to the last column at the same time. It is to be noted that the video signal inputted from the source signal line 412 of each column is independent from each other. The video signals inputted from the source signal line 412 are inputted to the gate electrodes of the driving transistors 402$a$, 402$b$, 402$c$, and 402$d$ through the switching transistor 401 connected to each source signal line. The light emitting elements 403$a$, 403$b$, 403$c$, and 403$d$ are determined to emit light or no light according to a potential difference between a first electrode and a second electrode thereof and signals inputted to the driving transistors 402$a$, 402$b$, 402$c$, and 402$d$ respectively. For example, in the case where the driving transistor is a P-channel transistor, any one of the light emitting elements 403a, 403b, 403c, and 403d emits light when a Low signal is inputted. On the other hand, in the case where the driving transistor is an N-channel transistor, any one of the light emitting elements 403a, 403b, 403c, and 403d emits light when a High signal is inputted.

At the same time as the writing to the source signal line is terminated, a write period in the n-th row (n is a natural number) is terminated and a hold period starts. Next, a write period starts in an (n+1)th row and a similar writing operation to the aforementioned one is performed. By repeating the aforementioned operation, a writing operation is performed from the first row to the last row.

As described above, with the light emitting elements 403a, 403b, and 403c emitting light sequentially, light emission color of each light emitting element is visually mixed by the afterimage effect, thereby various colors can be displayed. It is to be noted that light emission of which luminance is controlled by changing light emission time of each light emitting element are appropriately combined to obtain a desired display color. When the light emitting element 403d which exhibits white light emits light, the luminance of the displayed color is perceived to be increased. Thus, load imposed on the light emitting elements 403a, 403b, and 403c can be less than the case of increasing light emission time of the light emitting elements 403a, 403b, and 403c, to increase the luminance of the displayed color. As a result, life of each of the light emitting elements 403a, 403b, and 403c can be long. Moreover, when the light emitting element 403d which exhibits white light emits light, the light emitting device described above can display a high contrast image.

Described in this embodiment mode is the mode where all the light emitting elements emit light, however, a desired display color may be obtained with the light emitting elements 403a and 403b emitting light and the light emitting element 403c emitting no light. Alternatively, a desired display color may be obtained with any one of the light emitting elements 403a, 403b, and 403c emitting light. When a display color of low luminance is to be performed, the light emitting element 403d which exhibits white light emission does not necessarily emit light. The timing, light emission time and the like at which the light emitting element 403d which exhibits white light emission emits light are appropriately controlled in a series of display operation.

Embodiment Mode 4

In this embodiment mode, a light emitting device of the invention and a driving method thereof which are different than those described in Embodiment Mode 2 are described.

Figure 6:
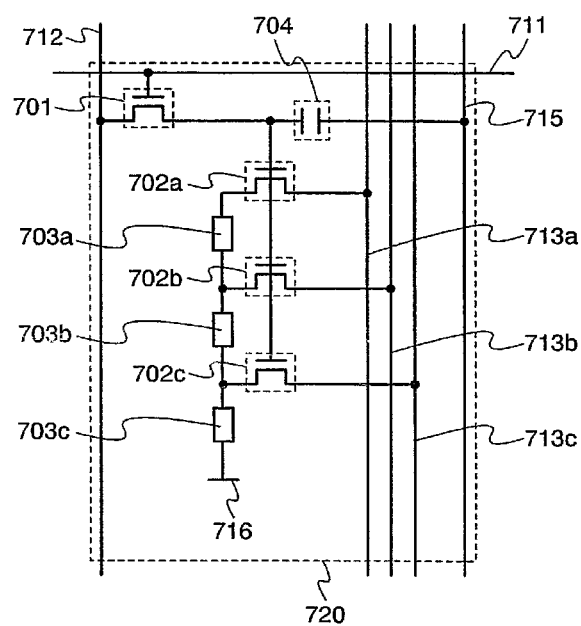
FIG. 6 is a diagram showing a driver circuit used in the light emitting device of the invention.

FIG. 6 is a diagram showing a circuit configuration of a pixel 720 included in the light emitting device of the invention.

A switching transistor 701, driving transistors 702a, 702b, and 702c each has three terminals: a gate electrode, a drain region, and a source region, in which a channel region is provided between the drain region and the source region. Here, the source region and the drain region cannot be clearly distinguished because of the structure, operating condition, and the like of the transistor, therefore, one of them is referred to as a first electrode while the other is referred to as a second electrode. Here, a switching transistor controls a video signal input to a driving transistor. The driving transistor determines light emission or no light emission of a light emitting element by controlling a current supply from a current supply line according to the inputted video signal. It is to be noted that the switching transistor 701, the driving transistors 702a, 702b, and 702c are not particularly limited and an organic thin film transistor containing a semiconductor layer formed of an organic compound can be used as well as a MOS transistor and the like. The switching transistor 701 may be an N-channel transistor or a P-channel transistor. Furthermore, the driving transistors 702a, 702b, and 702c may be an N-channel transistor or a P-channel transistor, however, it is preferable that they have the same polarity because they are controlled by the same video signal according to the example shown in FIG. 6.

Light emitting elements 703a, 703b, and 703c each has two terminals. Each of the light emitting elements 703a, 703b, and 703c has a light emitting layer between a first electrode and a second electrode, and emits light when a current flows by a potential difference between the first electrode and the second electrode. It is to be noted that when the driving transistors 702a, 702b, and 702c are P-channel transistors, the first electrode of each of the light emitting elements 703a, 703b, and 703c functions as an anode while the second electrode thereof functions as a cathode. On the other hand, when the driving transistors 702a, 702b, and 702c are N-channel transistors, the first electrode of each of the light emitting elements 703a, 703b, and 703c functions as a cathode while the second electrode thereof functions as an anode. The light emission colors of the light emitting elements 703a, 703b, and 703c are not particularly limited, however, it is preferable that they emit light of different colors. Further, it is preferable that any one of the light emitting elements exhibit white light emission or the white light emission is exhibited by mixing light emission of at least two light emitting elements. The light emitting element 703a exhibits red light emission when light is emitted outside the light emitting device, and the light emitting element 703b exhibits green light emission when light is emitted outside the light emitting element, the light emitting element 703c exhibits green light emission when light is emitted outside the light emitting device. Here, the red light emission corresponds to a color having color co-ordinates: $x=0.6$ or higher and $y=0.35$ or lower in the CIE-XYZ chromaticity diagram. The green light emission corresponds to a color having color co-ordinates: $x=0.3$ or lower and $y=0.6$ or higher in the CIE-XYZ chromaticity diagram. The blue light emission corresponds to a color having color co-ordinates: $x=0.15$ or lower and $y=0.2$ or lower in the CIE-XYZ chromaticity diagram. It is to be noted that the CIE-XYZ chromaticity diagram is a chromaticity diagram based on the tristimulus values of X, Y, and Z. The chromaticity diagram shows a color by x and y co-ordinate space based on the tristimulus values of X, Y and Z. It is to be noted that the chromaticity defines the kinds of light colors quantitatively, leaving aside brightness information.

In the switching transistor 701, a gate electrode is electrically connected to the gate signal line 711 while a first electrode is electrically connected to a source signal line 712. The light emitting elements 703a, 703b, and 703c are connected in series. The first electrode of the driving transistor 702a is electrically connected to a current supply line 713a while a second electrode thereof is electrically connected to the first electrode of the light emitting element 703a. In the driving transistor 702b, a first electrode is electrically connected to a current supply line 713b and the second electrode is electrically connected to the first electrode of the light emitting element 703b. In the driving transistor 702c, a first electrode is electrically connected to a current supply line 713c and a second electrode is electrically connected to the first electrode of the light emitting element 703c. In the driving transistor 702c, a first electrode is electrically connected to the current supply line 713c and a second electrode thereof is electrically connected to a first electrode of the light emitting element 703c. A second electrode of the light emitting element 703c is electrically connected to a power source 716. The gate electrodes of the driving transistors 702a, 702b, and 702c are electrically connected to each other. Furthermore, a capacitor 704 is provided between a capacitor line 715 and the gate electrodes of the driving transistors 702a, 702b, and 702c so that each potential of the gate electrodes of the driving transistors 702a, 702b, and 702c can be held. A second electrode of the switching transistor 701 is electrically connected to each of the gate electrodes of the driving transistors 702a, 702b, and 702c.

A driving method of such a circuit is described below.

When the gate signal line 711 is selected, the switching transistor 701 is turned on and a video signal is inputted to gate electrodes of the driving transistors 702a, 702b, and 702c from the source signal line 712 through the switching transistor 701. Here, when the switching transistor 701 is an N-channel transistor and the driving transistors 702a, 702b, and 702c are P-channel transistors, the driving transistors 702a, 702b, and 702c are turned on when the video signal is a Low signal while they are turned off when the video signal is a High signal. Moreover, when the current supply line 713a and the current supply line 713b have different potentials, a potential difference generates between the first electrode and the second electrode of the light emitting element 703a. Accordingly, a current is supplied to the light emitting element 703a and it emits light. When the current supply lines 713b and 713c have different potentials, a potential difference generates between the first electrode and the second electrode of the light emitting element 703b. Accordingly, a current is supplied to the light emitting element 703b and it emits light. When the current supply line 713c and the power source 716 have different potentials, a potential difference generates between the first electrode and the second electrode of the light emitting element 703c. Accordingly, a current is supplied to the light emitting element 703c and it emits light. When the current supply lines 713a and 713b, 713b and 713c, 713c and the power source 716 have different potentials respectively at the same time and then a potential difference generates between the first electrode and the second electrode of each of the light emitting elements 703a, 703b, and 703c, the light emitting elements 703a, 703b, and 703c emit light at the same time. As described above, the light emitting elements 703a, 703b, and 703c can emit light. A white light emission can be obtained when the light emitting elements 703a, 703b, and 703c emit light at the same time. The white light emission corresponds to a color having color co-ordinates: x=0.25 to 0.35 and y=0.25 to 0.35 in the CIE-XYZ chromaticity diagram, and preferably x=0.28 to 0.32 and y=0.28 to 0.32.

Next, a driving method of a light emitting device using the circuit configuration as described above is described.

In this embodiment mode also, the light emitting device has the structure shown in the schematic diagram of FIG. 2.

A pixel portion 6511 includes a plurality of source signal lines 712 which extend in the column direction arranged in the row direction. The current supply lines 713a, 713b, and 713c as one group are arranged in the row direction. Moreover, a plurality of gate signal lines 711 which extend in the row direction are arranged in the column direction. The pixel portion 6511 includes a circuit having a similar configuration to that described with reference to FIG. 6. A plurality of the circuit of FIG. 6 are arranged in the longitudinal and lateral direction, each of which includes the gate signal line 711, the source signal line 712, the current supply line 713, the power source 716, the switching transistor 701, the driving transistors 702a, 702b, and 702c, the light emitting elements 703a, 703b, and 703c, and the capacitor 704.

The light emission colors of the light emitting elements 703a, 703b, and 703c are not particularly limited. It is to be noted in this embodiment mode that the light emitting element 703a exhibits red light emission, the light emitting element 703b exhibits green light emission, and the light emitting element 703c exhibits blue light emission. It is to be noted that the red, green, and blue colors described here are similar to those described in Embodiment Mode 1.

Figure 7:
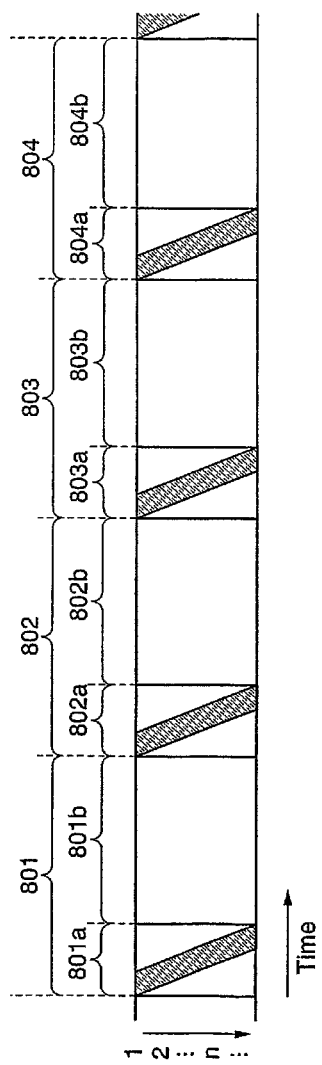
FIG. 7 is a diagram showing a driving method of the light emitting device of the invention.

Next, a driving method is described. FIG. 7 is a diagram showing an operation of a frame with time. In FIG. 7, the lateral direction denotes time while the longitudinal direction denotes a scan stage of the gate signal line.

When displaying an image by using the light emitting device of the invention, a write operation and a display operation of the image are repeated in the display period. The number of this write operation is not particularly limited, however, it is preferable that it is performed at least about 60 times in one second so that a viewer does not sense a flicker. Here, a period including a write period and a display period for one image (one frame) is referred to as one frame period.

One frame is divided by time division into subframes 801, 802, 803, and 804 each of which includes a write period 801a and a hold period 801b, a write period 802a and a hold period 802b, a write period 803a and a hold period 803b, and a write period 804a and a hold period 804b respectively.

First, in the subframe 801, the write operation is performed from the first row to the last row. Therefore, a start time of the write period 801a is different in each row. After the write period 801a, the hold period 801b starts. A light emitting element connected to a driving transistor to which a signal for emitting light is supplied in the write period 801a emits light when different potentials are applied in the hold period 801b to the first electrode and the second electrode which sandwich a light emitting layer. In this embodiment mode, different potentials are applied to the first electrode and the second electrode of the light emitting element 703; thus it emits light. At this time, a first electrode and a second electrode included in each of the light emitting elements 703b and 703c are applied potentials so that they have the same potentials. After the hold period 801b is terminated, the next subframe 802 starts and a write operation is performed from the first row to the last row similarly to the subframe 801. Then, the light emitting element 703b emits light in the hold period 802b. After the hold period 802b is terminated in the subframe 802, the subframe 803 starts. In the subframe 803, the light emitting element 703c emits light. After the hold period 803b is terminated in the subframe 803, the subframe 804 starts. In the subframe 804, the light emitting elements 703; 703b, and 703c emit light at the same intensity. By repeating the aforementioned operations, up to the hold period 804b of the subframe 804 are terminated. After the operation in the subframe 804 is terminated, a next frame starts. It is to be noted that the light emitting elements 703a, 703b, and 703c emit light in this order in this embodiment mode, however, the order of the light emission is not particularly limited and may be changed appropriately.

Next, a drive of a pixel in the write period is described. In the write period, the n-th (n is a natural number) gate signal line 711 is selected and the switching transistor 701 connected to the gate signal line 711 is turned on. At this time, a video signal is inputted to the source signal lines of the first column to the last column at the same time. It is to be noted that the video signals inputted from the source signal line 712 of each column are independent from each other. The video signals inputted from the source signal lines 712 are inputted to the gate electrodes of the driving transistors 702a, 702b, and 702c through the switching transistor 701 connected to each source signal line. At this time, the light emitting elements 703a, 703b, and 703c are determined to emit light or no light according to a potential difference between a first electrode and a second electrode thereof and signals inputted to the driving transistors 702a, 702b, and 702c respectively. For example, when the driving transistor is a P-channel transistor, any one of the light emitting elements 703a, 703b, and 703c emits light with a Low signal being inputted. On the other hand, when the driving transistor is an N-channel transistor, at least one of the light emitting elements 703a, 703b, and 703c emits light with a High signal being inputted.

When the write operation to the source signal line is terminated, the write period in the n-th row (n is a natural number) is terminated and a hold period starts. Next, a write period starts in the (n+1)th row and a similar write operation is performed. By repeating the aforementioned operations, the write operation is performed from the first row to the last row.

As described above, with the light emitting elements 703a, 703b, and 703c emitting light sequentially, light emission color of each light emitting element is visually mixed by the afterimage effect, thereby various colors can be displayed. It is to be noted that light emission of which luminance is controlled by changing a voltage applied to each light emitting element are appropriately combined to obtain a desired display color. When white light is emitted by making the light emitting elements 703a, 703b, and 703c emitting light at the same intensity at the same time, the luminance of the displayed color is perceived to be increased. Thus, load imposed on the light emitting elements 703a, 703b, and 703e can be less than the case of increasing a voltage applied to the light emitting elements 703a, 703b, and 703c, to increase the luminance of the displayed color. As a result, life of each of the light emitting elements 703a, 703b, and 703c can be long. Moreover, when white light emission is exhibited, the light emitting device described above can display a high contrast image.

Described in this embodiment mode is the mode where all the light emitting elements emit light, however, a desired display color may be obtained with the light emitting elements 703a and 703b emitting light and the light emitting element 703c emitting no light. Alternatively, a desired display color may be obtained with any one of the light emitting elements 703a, 703b, and 703c emitting light. When a display color of low luminance is to be performed, the light emitting elements 703a, 703b, and 703c are not necessarily used for white light emission. The timing, luminance and the like for emitting white light are appropriately controlled in a series of display operations.

Embodiment Mode 5

Figure 8:
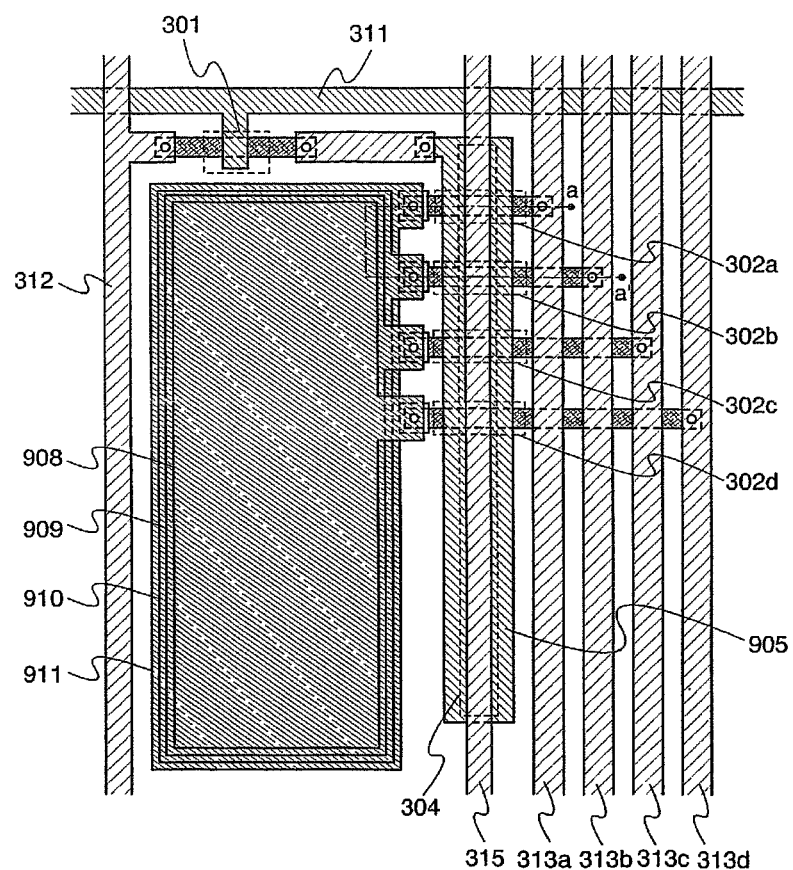
FIG. 8 is a top plan view of a pixel portion of the light emitting device of the invention.
Figure 9:
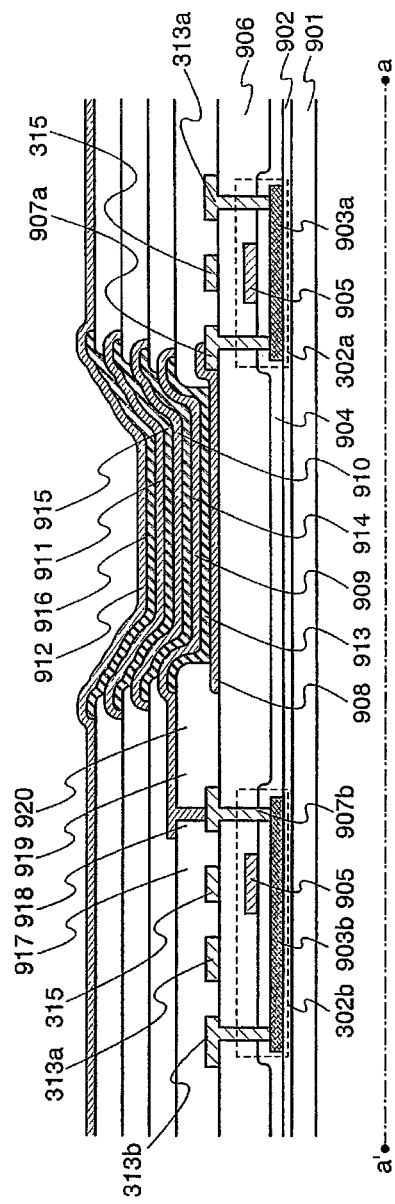
FIG. 9 is a sectional diagram of a pixel portion of the light emitting device of the invention.

FIG. 8 is a top plan view of a pixel having the configuration described in Embodiment Mode 1. FIG. 9 is a sectional diagram of FIG. 8 taken along a broken line a-a'.

In FIG. 8, each reference numeral of 301, 302a, 302b, 302c, 302d, 304, 311, 312, 313a, 313b, 313c, 313d, and 315 denotes a similar portion to that shown in FIG. 1.

The switching transistor 301 and gate electrodes of the driving transistors 302a, 302b, 302c, and 302d are connected to each other through wirings formed of the same layer as the source signal line 312.

The driving transistor 302a is formed by stacking a semiconductor layer 903a, the gate insulating layer 904, and the gate electrode 905 as shown in FIG. 9. The driving transistor 302b is formed by stacking a semiconductor layer 903b, a gate insulating layer 904, and a gate electrode 905 as shown in FIG. 9. It is noted that reference numeral 901 denotes a substrate and 902 denotes a base insulating layer.

As shown in FIG. 8, the capacitor line 315 is provided so as to overlap the gate electrode 905. As shown in FIG. 9, an insulating layer 906 is provided between the gate electrode 905 and the capacitor line 315 to form the capacitor 304.

The semiconductor layer 903a and the current supply line 313a are connected to each other through a connecting portion which is formed through the insulating layer 906. An electrode 908 of a light emitting element is provided in the same layer as the current supply line 313a and the like and connected to the semiconductor layer 903a through a connecting portion 907a which is formed through the insulating layer 906. With such a structure, the driving transistor 302a is electrically connected to the current supply line 313a and the electrode 908 of the light emitting element.

The semiconductor layer 903b and the current supply line 313b are connected to each other through a connecting portion which is formed through the insulating layer 906. An electrode 909 of the light emitting element is connected to the semiconductor layer 903b through a connecting portion 907b which is formed through the insulating layer 906. With such a structure, the driving transistor 302b is electrically connected to the current supply line 313b and the electrode 909 of the light emitting element. It is to be noted that the electrode 909 of the light emitting element is provided over an insulating layer 917 having an aperture and covering the current supply line 313a and the like.

A light emitting layer 913 is provided between the electrode 908 and the electrode 909 of the light emitting element. A light emitting layer 914, an electrode 910 of the light emitting element, a light emitting layer 915, an electrode 911 of the light emitting element, a light emitting layer 916, an electrode 912 of the light emitting element are stacked in this order over the electrode 909 of the light emitting element. The electrode 908 of the light emitting element, the light emitting layer 913, and the electrode 909 of the light emitting element form a first light emitting element, the electrode 909 of the light emitting element, the light emitting layer 914, and the electrode 910 of the light emitting element form a second light emitting element, the electrode 910 of the light emitting element, the light emitting layer 915, and the electrode 911 of the light emitting element form a third light emitting element, and the electrode 911 of the light emitting element, the light emitting layer 916, and the electrode 912 of the light emitting element form a fourth light emitting element. It is to be noted that each of the electrodes 908, 909, 910, 911, and 912 is provided in different layers with insulating layers 918, 919, and 920 each having an aperture interposed therebetween. The first, second, third, and fourth light emitting elements are provided in the apertures of the insulating layers 917, 918, 919, and 920.

Here, the electrodes 909, 910, and 911 of the light emitting element each functions as both the first electrode and the second electrode of the light emitting element described in Embodiment Mode 1. For example, the electrode 909 of the light emitting element functions as a second electrode of the first light emitting element while it functions as a first electrode of the second light emitting element. The electrode 912 of the light emitting element functions as a second electrode of the fourth light emitting element and as the power source 316 described in Embodiment Mode 1. In FIG. 8, the size of the electrodes 908, 909, 910, and 911 are different and descends in this order, however, this is only shown for describing that the electrodes are provided in different layers. Therefore, the size of the electrodes 908, 909, 910, and 911 are not limited.

It is to be noted that the structures of the switching transistor 301, the driving transistors 302a, 302b, 302c, and 302d are not particularly limited. They may have any of a top gate or a bottom gate structure, a single drain structure or an LDD (Lightly Doped Drain) structure, and a single gate structure or a multi-gate structure. The crystallinity of the semiconductor layer included in the switching transistor 301, the driving transistors 302a, 302b, 302c, and 302d is not particularly limited and it may be an amorphous semiconductor, a crystalline semiconductor, a semiconductor mixed with crystalline and amorphous, or a semi-amorphous semiconductor. Here, the semi-amorphous semiconductor has an intermediate structure between the amorphous and crystalline (including a single crystal and polycrystal) semiconductors and a third state which is stable in free energy and includes a crystalline region containing a short range order and lattice distortion. At least a portion of the film contains crystal grains of 0.5 to 20 nm. Raman spectrum is shifted toward lower wave numbers than 520 cm$^{-1}$. The diffraction peaks of (111) and (220), which are believed to be derived from Si crystal lattice, are observed in the semi-amorphous semiconductor film by X-ray diffraction. The semi-amorphous semiconductor film contains hydrogen or halogen of at least 1 atom % or more for terminating dangling bonds. The semi-amorphous semiconductor is also referred to as a so-called microcrystalline semiconductor and obtained by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$ and the like can be used. The silicide gas may also be diluted with $H_2$, or a mixture of $H_2$ and one or more of rare gas elements selected from He, Ar, Kr, and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or less, preferably, 100 to 250° C. With respect to impurity elements contained in the film, each concentration of impurities for atmospheric constituents such as oxygen, nitrogen, and carbon is preferably set to be $1\times10^{20}/cm^3$ or less. In particular, the oxygen concentration is set to be $5\times10^{19}/cm^3$ or less, preferably, $1\times10^{19}/cm^3$ or less. The mobility of the TFT using the semi-amorphous semiconductor film is 1 to 10 $cm^2/Vsec$.

The light emitting layers 913, 914, 915, and 916 are not particularly limited, and they may be formed of a single layer or multiple layers. A substance which forms the light emitting layer is not particularly limited either. In this embodiment mode, the light emitting layer 913 exhibits red light emission, the light emitting layer 914 exhibits green light emission, the light emitting layer 915 exhibits blue light emission, and the light emitting layer 916 exhibits white light emission, however, light emission color of each light emitting element is not limited to these.

For forming the light emitting layer 913 which exhibits red light emission, for example, the light emitting layer containing such as 4-dicyanomethylene-2-methyl-6-[2-(1,1,7,7-tetramethyl-9-julolidyl)ethenyl]-4H-pyran (DCJT), 4-dicyanomethylene-2-t-butyl-6-[2-(1,1,7,7-tetramethyl julolidine-9-yl)ethenyl]-4H-pyran (DCJTB), periflanthene and 2,5-dicyano-1,4-bis[2-(10-methoxy-1,1,7,7-tetramethyl julolidine-9-yl)ethenyl]benzene, may be used. Besides, a substance such as a metal complex, which exhibits light emission from an excited triplet state may be used as well.

For forming the light emitting layer 914 which exhibits green light emission, a light emitting layer containing N,N'-dimethylquinacridon (DMQd), coumarin 6, coumarin 545T, tris(8-quinolinolato)aluminum (Alq3) and the like is formed. Besides, a substance such as a metal complex, which exhibits light emission from an excited triplet state may be used as well.

For forming the light emitting layer 915 which exhibits blue light emission, a light emitting layer containing 9,9'-bianthryl, 9,10-diphenylanthracene (DPA), 9,10-bis(2-naphthyl)anthracene (DNA) and the like is formed. Besides, a substance such as a metal complex, which exhibits light emission from an excited triplet state may be used as well.

It is to be noted that a layer formed of a substance having high carrier (electrons/holes) transporting property may be provided in a portion of the light emitting layers 913, 914, 915, and 916. Accordingly, a phenomenon that the light emitting portion emits no light due to an electrode being provided too close to the light emitting portion can be prevented.

Here, the substance having high electron transporting property is, for example, a metal complex having quinoline skeleton or benzoquinoline skeleton, such as tris(8-quinolinolato)aluminum ($Alq_3$), tris(5-methyl-8-quinolinolato)aluminum ($Almq_3$), bis(10-hydroxybenzo[h]-quinolinolato)beryllium (BeBq2), bis(2-methyl-8-quinolinolato)-4-phenylphenolato-aluminum (BAlq) and the like. The substance having high hole transporting property is, for example, an aromatic amine compound (that is, a compound having a benzene ring-nitrogen bond) such as 4,4'-bis[N-(1-naphthyl)-N-phenyl-amino]-biphenyl (α-NPD), 4,4'-bis[N-(3-methylphenyl)-N-phenyl-amino]-biphenyl (TPD), 4,4',4"-tris(N,N-diphenyl-amino)-triphenylarnine (TDATA), or 4,4',4"-bis[N-(3-methylphenyl)-N-phenyl-amino]-triphenylamine (MTDATA).

A layer for aiding electron or hole injection to the light emitting layers 913, 914, 915, and 916 from the electrodes of the light emitting element may be provided in a portion of the light emitting layers 913, 914, 915, and 916.

As a substance which can aid electron injection, an alkaline metal or an alkaline earth metal compound such as lithium fluoride (LiF), cesium fluoride (CsF), calcium fluoride ($CaF_2$), and the like can be used. Moreover, a mixture of and a substance having high electron transporting property such as $Alq_3$ and an alkaline earth metal such as magnesium (Mg) may be used as well. As a substance which can aid hole injection, for example, metal oxide such as molybdenum oxide (MoOx), vanadium oxide (VOx), ruthenium oxide (RuOx), tungsten oxide (WOx), and manganese oxide (MnOx) can be used. Besides, a phthalocyanine-based compound such as phthalocyanine ($H_2Pc$) and copper phthalocyanine (CuPC) can be used. Moreover, a high molecular weight material obtained by mixing polystyrene sulfonate (PSS) having high hole injection and transporting properties, polyethylene dioxythiophene (PEDOT), and the like may be used.

It is to be noted that a high molecular weight organic light emitting material is physically stronger than a low molecular weight organic light emitting material, which results in forming more durable elements. Moreover, as a high molecular weight organic light emitting material can be deposited by coating, elements can be relatively easily formed.

For forming the light emitting layer 916 which exhibits white light emission, for example, white light emission can be obtained by stacking $Alq_3$, $Alq_3$ partially doped with Nile Red, $Alq_3$, p-EtTAZ, TPD (aromatic diamine) in this order by deposition. Further, when forming the light emitting layer by spin coating, it is preferable to bake the substrate in vacuum after the coating. For example, polyethylene dioxythiophene/polystyrene sulfonate aqueous (PEDOT/PSS) is deposited over the entire surface and baked. Then, a polyvinyl carbazole (PVK) solution doped with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is deposited over the entire surface and baked.

It is to be noted that when the driving transistors 302a, 302b, 302c, and 302d are P-channel transistors, it is preferable in the light emitting layers 913, 914, 915, and 916 that a layer in which holes can easily transport is formed on the electrode 908 side of the light emitting element and a layer in which electrons can easily transport is provided on the electrode 912 side of the light emitting element. When the driving transistors 302a, 302b, 302c, and 302d are N-channel transistors, it is preferable in the light emitting layers 913, 914, 915, and 916 that a layer in which electrons can easily transport is provided on the electrode 908 side of the light emitting element and a layer in which holes can easily transport is provided on the electrode 912 side of the light emitting element.

It is preferable that the electrodes 909, 910, and 911 of the light emitting element can transmit visible light. As such a substance, indium tin oxide, indium tin oxide containing silicon oxide, indium zinc oxide obtained by mixing 2 to 20% of zinc oxide (ZnO) with indium oxide, or zinc gallium oxide obtained by mixing several % of gallium oxide ($Ga_2O_3$) with zinc oxide can be used, however, other substances than these may be used as well.

It is preferable that at least one of the electrodes 908 and 912 of the light emitting element is formed of such a substance which can transmit visible light as described above. When one electrode is formed of a substance which can transmit visible light, it is preferable that the other electrode is formed of a substance having low work function such as aluminum in the case of functioning as a cathode, and formed of a substance having high work function such as silver in the case of functioning as an anode.

The light emitting device of the invention having the aforementioned structure can exhibit white light emission. Moreover, when displaying a color by using a light emission of at least one of the first, second, and third light emitting elements, the luminance thereof can be further increased by using a light emission of the fourth light emitting element which exhibits white light emission.

Embodiment Mode 6

Figure 10A:
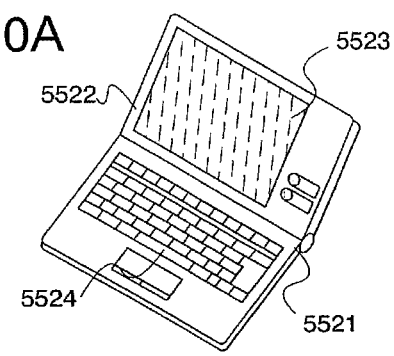
FIGS. 10A to 10C are views illustrating electronic apparatuses to which the invention is applied.
Figure 10B:
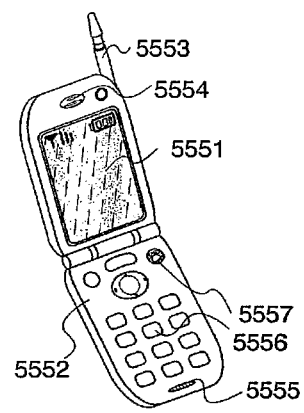
Figure 10C:
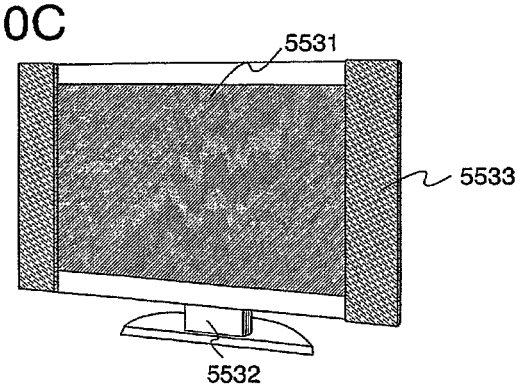

FIGS. 10A to 10C are views of electronic apparatuses to which the light emitting device of the invention is applied.

FIG. 10A illustrates a computer to which the invention is applied, including a main body 5521, a housing 5522, a display portion 5523, a keyboard 5524 and the like. By incorporating the light emitting device of the invention as the display portion 5523, a computer can be completed. A mode of the computer is not particularly limited and it may be a desktop or laptop computer.

FIG. 10B illustrates a mobile phone to which the invention is applied, including a main body 5552, a display portion 5551, an audio output portion 5554, an audio input portion 5555, operating switches 5556 and 5557, an antenna 5553 and the like. By incorporating the light emitting device of the invention as the display portion 5551, the mobile phone can be completed.

FIG. 10C illustrates a television receiver to which the invention is applied, including a display portion 5531, a housing 5532, a speaker 5533 and the like. By incorporating the light emitting device of the invention as the display portion 5531, the television receiver can be completed.

The light emitting device of the invention is quite suitable for being applied to display portions of various electronic apparatuses as described above.

Although a computer is taken as an example in this embodiment mode, the light emitting device of the invention may be incorporated in a mobile phone, a car navigation system, lighting and the like.

The electronic apparatuses as described above can provide favorable display images with less degradation for a long time by using the light emitting device of the invention in the display portion.

This application is based on Japanese Patent Application serial No. 2004-126798 filed in Japan Patent Office on Apr. 22, 2004, the entire contents of which are hereby incorporated by reference.

What is claimed is:

1. A driving method of a display device including a first gate signal line and a first pixel in a first row, and a second gate signal line and a second pixel in a second row, comprising the steps of:

applying a first gate signal to the first pixel in the first row, and sequentially making the first pixel emit light of a first color based on the first gate signal; and applying a second gate signal to the second pixel in the second row, and sequentially making the second pixel emit light of a second color based on the second gate signal, wherein each of the first pixel and the second pixel includes at least four light emitting elements stacked with each other, and one of the at least four light emitting elements exhibits white light emission.

2. The driving of a display device according to claim 1, wherein the first color and the second color are a different color from each other.

3. The driving of a display device according to claim 1, wherein the first color is any one of red, green and blue.

4. The driving of a display device according to claim 1, wherein the first gate signal is applied through a first transistor, and wherein the second gate signal is applied through a second transistor.

5. A driving method of a display device including a first gate signal line and a first pixel in a first row, and a second gate signal line and a second pixel in a second row, comprising the steps of:

applying a video signal from a source signal line to the first pixel in the first row and the second pixel in the second row;

applying a first gate signal to the first pixel in the first row, and sequentially making the first pixel emit light of a first color based on the first gate signal; and applying a second gate signal to the second pixel in the second row, and sequentially making the second pixel emit light of a second color based on the second gate signal, wherein each of the first pixel and the second pixel includes at least four light emitting elements stacked with each other, and one of the at least four light emitting elements exhibits white light emission.

6. The driving of a display device according to claim 5, wherein the first color and the second color are a different color from each other.

7. The driving of a display device according to claim 5, wherein the first color is any one of red, green and blue.

8. The driving of a display device according to claim 5, wherein the first gate signal is applied through a first transistor, and wherein the second gate signal is applied through a second transistor.

* * * * *